(12) United States Patent
Shirai et al.

(10) Patent No.: US 6,976,888 B2
(45) Date of Patent: Dec. 20, 2005

(54) LGA SOCKET CONTACT

(75) Inventors: Hiroshi Shirai, Tokorozawa (JP);
Shinichi Hashimoto, Kawasaki (JP);
Hidenori Taguchi, Kawasaki (JP)

(73) Assignee: Tyco Electronics AMP K.K., Kanagawa-Ken (JP)

( * ) Notice: Subject to any disclaimer, the term of this patent is extended or adjusted under 35 U.S.C. 154(b) by 30 days.

(21) Appl. No.: 10/662,006

(22) Filed: Sep. 12, 2003

(65) Prior Publication Data

US 2004/0058580 A1 Mar. 25, 2004

(30) Foreign Application Priority Data

Sep. 12, 2002 (JP) .................................... 2002-267103
Jul. 7, 2003 (JP) .................................... 2003-193009

(51) Int. Cl.[7] ............................................... H01R 4/48
(52) U.S. Cl. ..................... 439/862; 439/733.1; 439/885
(58) Field of Search ............................ 439/862, 733.1, 439/70, 71

(56) References Cited

U.S. PATENT DOCUMENTS

| | | | | |
|---|---|---|---|---|
| 3,923,365 A | * | 12/1975 | Lynch ......................... | 439/751 |
| 4,857,001 A | * | 8/1989 | Nakano et al. ................ | 439/68 |
| 5,425,658 A | * | 6/1995 | White ......................... | 439/637 |
| 5,688,140 A | * | 11/1997 | McHugh et al. .............. | 439/342 |
| 5,885,118 A | * | 3/1999 | Billenstein et al. ........... | 439/862 |
| 5,915,988 A | * | 6/1999 | Bitsch et al. ................ | 439/398 |
| 5,984,693 A | | 11/1999 | McHugh et al. .............. | 439/66 |
| 6,113,440 A | * | 9/2000 | Fijten et al. ................. | 439/862 |
| 6,164,978 A | | 12/2000 | McHugh et al. .............. | 439/66 |
| 6,299,492 B1 | | 10/2001 | Pierini et al. ................ | 439/884 |
| 6,315,621 B1 | * | 11/2001 | Natori et al. ................ | 439/862 |
| 2002/0111052 A1 | | 8/2002 | Noda et al. .................. | 439/71 |

* cited by examiner

Primary Examiner—Neil Abrams
(74) Attorney, Agent, or Firm—Barley Snyder LLC (57) ABSTRACT

A land grid array socket contact has a resilient contact that extends parallel to a base plate and is attached to at least one side walls of the base plate by a curved section angled approximately 180 degrees from the at least one side wall. The resilient contact has a free end for contacting a contact pad. A board terminal extends from a lower end of the base plate for connection to a circuit board. In another embodiment, the land grid array socket contact has a resilient contact extending from an upper end of a base plate. The resilient contact has an elongated slit substantially in a center of the resilient contact with respect to a direction of width and a free end for contacting a contact pad. A board terminal extends from a lower end of the base plate for connection to a circuit board.

21 Claims, 10 Drawing Sheets

LGA SOCKET CONTACT

FIELD OF THE INVENTION

The invention relates to a land grid array (LGA) socket contact for use in an LGA socket.

BACKGROUND OF THE INVENTION

Figure 7:
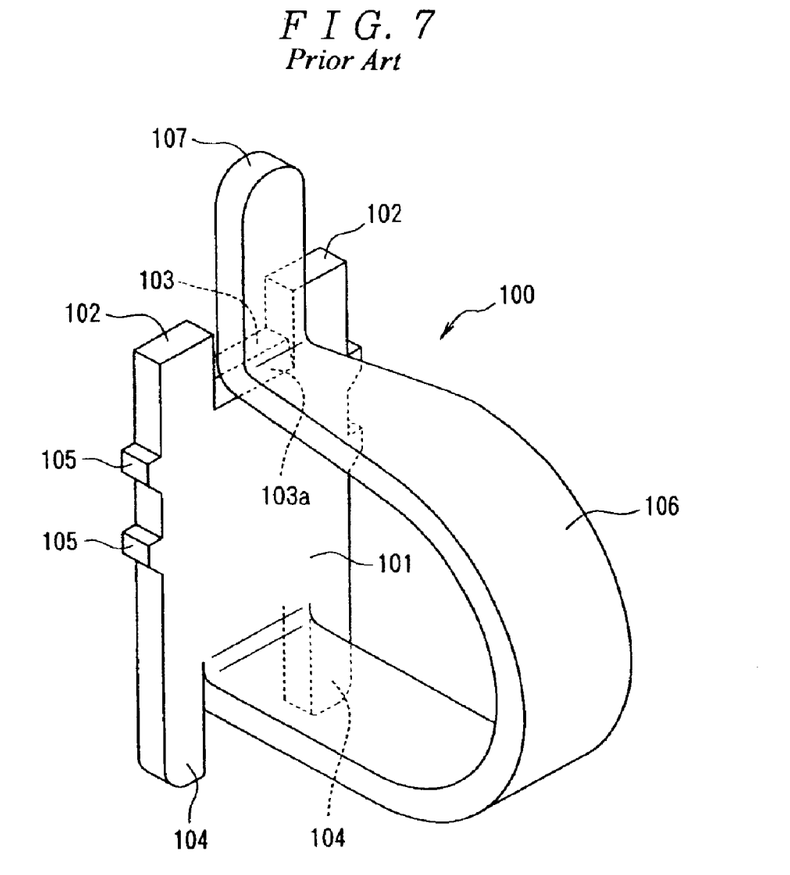
FIG. 7 is a perspective view of a conventional LGA socket contact.
Figure 8:
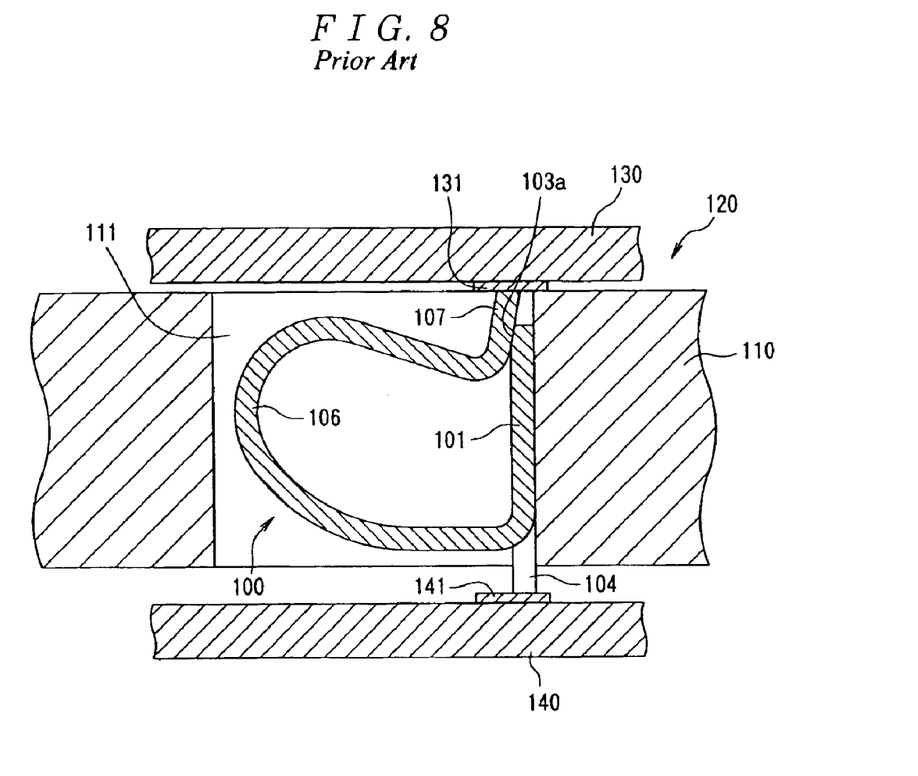
FIG. 8 is a sectional view of the LGA socket contact of FIG. 7 wherein the LGA socket contact is accommodated inside a housing.

LGA sockets are used to connect circuit boards with integrated circuit (IC) sockets that have a plurality of contact pads on a bottom surface thereof. FIGS. 7 and 8 illustrate a conventional contact 100 used in an LGA socket 120 (see U.S. Pat. No. 5,984,693). As shown in FIG. 7, the contact 100 is formed by stamping and forming a metal plate and has a substantially rectangular base plate 101. Guide projections 102 are formed on both ends of an upper edge 103 of the base plate 101 and protrude upward. Engaging pins 104 are formed on both ends of a lower edge of the base plate 101 and protrude downward. Two anchoring projections 105 are formed in positions that are separated by a specified distance in a vertical direction on each of two side walls of the base plate 101. An elastic C-shaped engaging portion 106 extends from between the engaging pins 104. The C-shaped engaging portion 106 is bent so that it is folded back in an upward direction and is formed on the lower edge of the base plate 101. A contact plate portion 107 is bent so that it extends upward from a free end of the elastic C-shaped engaging portion 106. The contact plate portion 107 is separated by a specified distance from an inclined surface 103a formed between the guide projections 102 on the upper edge 103 of the base plate 101. The contact plate portion 107 contacts the inclined surface 103a when an external force is applied to the contact plate portion 107 in a downward direction.

As shown in FIG. 8, the contact 100 is received inside a contact accommodating space 111 of a housing 110 to complete the LGA socket 120. When the contact 100 is received in the contact accommodating space 111, the anchoring projections 105 of the contact 100 engage walls of the housing 11. The contact plate portion 107 protrudes upward beyond an upper surface of the housing 110, and the engaging pins 104 protrude downward beyond an undersurface of the housing 110.

As shown in FIG. 8, the LGA socket 120 is clamped between an IC package 130 and a circuit board 140. In the clamped state, the engaging pins 104 contact a first contact pad 141 formed on a surface of the circuit board 140. A second contact pad 131 formed on the IC package 130 pushes the contact plate portion 107 downward so that the contact plate portion 107 contacts the inclined surface 103a. As a result of the contact between the contact plate portion 107 and the inclined surface 103a, an electrical short-circuiting path is formed between the contact plate portion 107 and the engaging pins 104. The second contact pad 131 of the IC package 130 and the first contact pad 141 of the circuit board 140 are thereby electrically connected to each other.

The conventional contact 100, however, has the disadvantage that that it is unsuitable for use in applications wherein the engaging pins 104 and first contact pad 141 are connected by soldering, because the engaging pins 104 are forced into contact with the first contact pad 141 of the circuit board 140. In addition, when the second contact pad 131 formed on the IC package 130 contacts the contact plate portion 107, the second contact pad 131 contacts a cut surface of the contact plate portion 107 that is formed when the contact 100 is stamped causing stability of the contact 100 to be poor.

Figure 9:
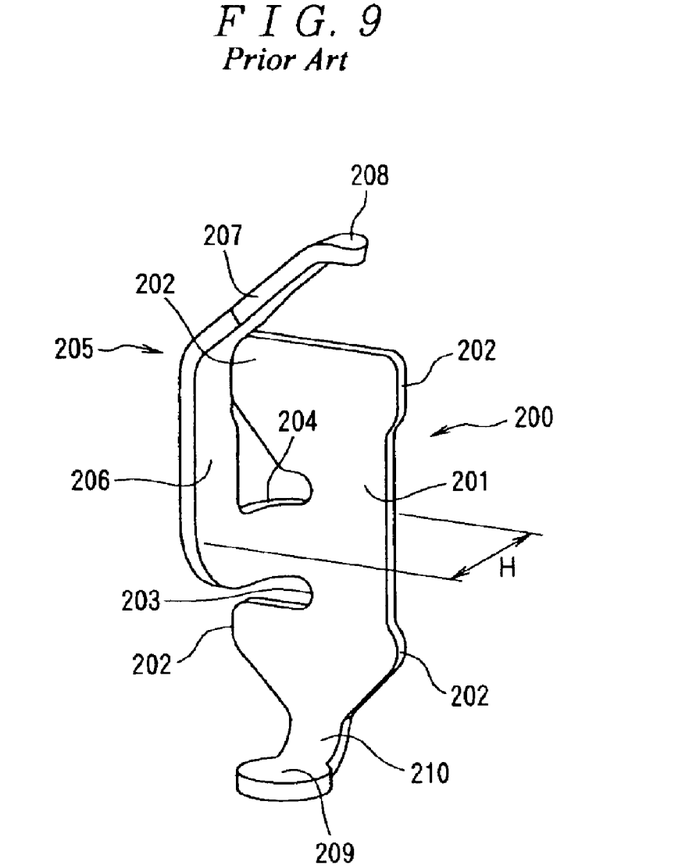
FIG. 9 is a perspective view of another conventional LGA socket contact.
Figure 10:
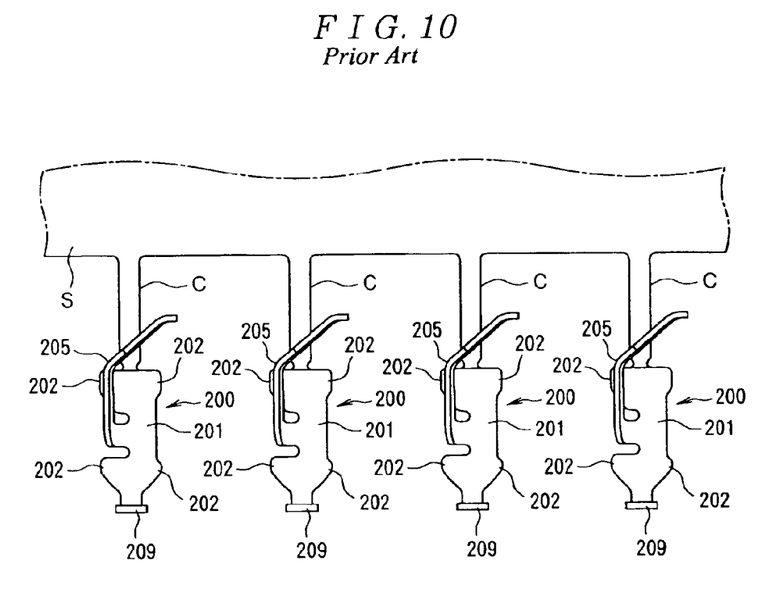
FIG. 10 is a plan view of the LGA socket contact of FIG. 9 attached to a strip.

FIGS. 9 and 10 illustrate an LGA socket contact 200 developed to solve these problems. The contact 200 is formed by stamping and forming a metal plate and has a substantially rectangular base plate 201. Two anchoring projections 202 are formed on each side wall of the base plate 201 and are separated by a specified distance in a vertical direction. A cut-out 203 is formed between the anchoring projections 202 in one of the side walls of the base plate 201. A resilient contact 205 is formed via an L-shaped base portion 204 and is angled approximately 90 degrees from the cut-out 203. The resilient contact 205 has a first elastic plate portion 206 that extends upward from a free end of the L-shaped base portion 204. A second elastic plate portion 207 extends upward at an inclination toward the opposite anchoring projection 202 from an upper end of the first elastic plate portion 206. The direction of extension of the first elastic plate portion 206 is perpendicular to the direction of extension of the base plate 201. The direction of extension of the second elastic plate portion 207 is also perpendicular to the direction of extension of the base plate 201. A contact portion 208 contacts a contact pad (not shown) formed on an IC package (not shown). The contact portion 208 has a rolled surface formed on a free end of the second elastic plate portion 207 that contacts the contact pad (not shown) of the IC package (not shown) to ensure good contact stability.

A solder ball attachment paddle 209 extends in a direction perpendicular to the base plate 201 via a connecting portion 210 and is disposed on a lower edge of the base plate 201. A solder ball (not shown) is disposed on an undersurface of the solder ball attachment paddle 209. The solder ball attachment paddle 209 is soldered to a contact pad (not shown) on a circuit board (not shown).

As shown in FIG. 10, each of the contacts 200 is manufactured connected to a strip S. The upper end of the base plate 201 of each of the contacts 200 is connected to a contact carrier C extending from the strip S.

The LGA socket contact 200, however, has several disadvantages. Because the first elastic plate portion 206 of the resilient contact 205 extends from the free end of the L-shaped base portion 204, and the direction of extension of the plate surface of the first elastic plate portion 206 is perpendicular to the direction of extension of the plate surface of the base plate 201, a height H from a back surface of the base plate 201 to an edge of the first elastic plate portion 206, i.e., the height of the resilient contact 205 in the direction perpendicular to the base plate 201 in the vicinity of a root of the resilient contact 205, is large. Thus, in cases where the contact 200 is arranged in a direction perpendicular to the base plate 201, the ability to reduce the arrangement pitch is severely restricted. For example, if a width of the first elastic plate portion 206 is minimized in order to reduce the arrangement pitch in the direction perpendicular to the base plate 201, the amount of displacement of the resilient contact 205 must remain small to prevent plastic deformation of the first elastic plate portion 206 in cases where even a small external force is applied to the contact portion 208 in a downward direction. Further, if the width of the first elastic plate portion 206 is reduced, the cross-sectional area of the first elastic plate portion 206 is also reduced causing an increase in connection resistance.

SUMMARY OF THE INVENTION

It is therefore an object of the invention to provide an LGA socket contact structured so that the size of a resilient contact in a direction perpendicular to a base plate in a vicinity of a root of the resilient contact is minimized so that an arrangement pitch in this direction may be reduced. It is a further object of the invention to provide an LGA socket contact wherein the resilient contact may be displaced by a large amount to minimize connection resistance.

This and other objects are achieved by an LGA socket contact that has a base plate with side walls. A resilient contact extends parallel to the base plate. The resilient contact is attached to at least one of the side walls of the base plate by a curved section angled approximately 180 degrees from the at least one side wall. The resilient contact has a free end for contacting a contact pad. A board terminal extends from a lower end of the base plate for connection to a circuit board.

This and other objects are further achieved by a land grid array socket contact that is formed from a metal plate and has a base plate with side walls. A resilient contact extends parallel to the base plate and is attached to at least one of the side walls of the base plate by a curved section so that a height of the curved section and the resilient contact in a direction perpendicular to the base plate is substantially twice the thickness of the metal plate. The resilient contact has a free end for contacting a contact pad. A board terminal extends from a lower end of the base plate for connection to a circuit board.

This and other objects are still further achieved by a land grid array socket contact that has a base plate and a resilient contact that extends from an upper end of the base plate. The resilient contact has an elongated slit substantially in a center of the resilient contact with respect to a direction of width. The resilient contact has a free end for contacting a contact pad. A board terminal extends from a lower end of the base plate for connection to a circuit board.

BRIEF DESCRIPTION OF THE DRAWINGS

FIG. 6 shows a third embodiment of the LGA socket contact of the invention.

DETAILED DESCRIPTION OF THE INVENTION

Figure 1:
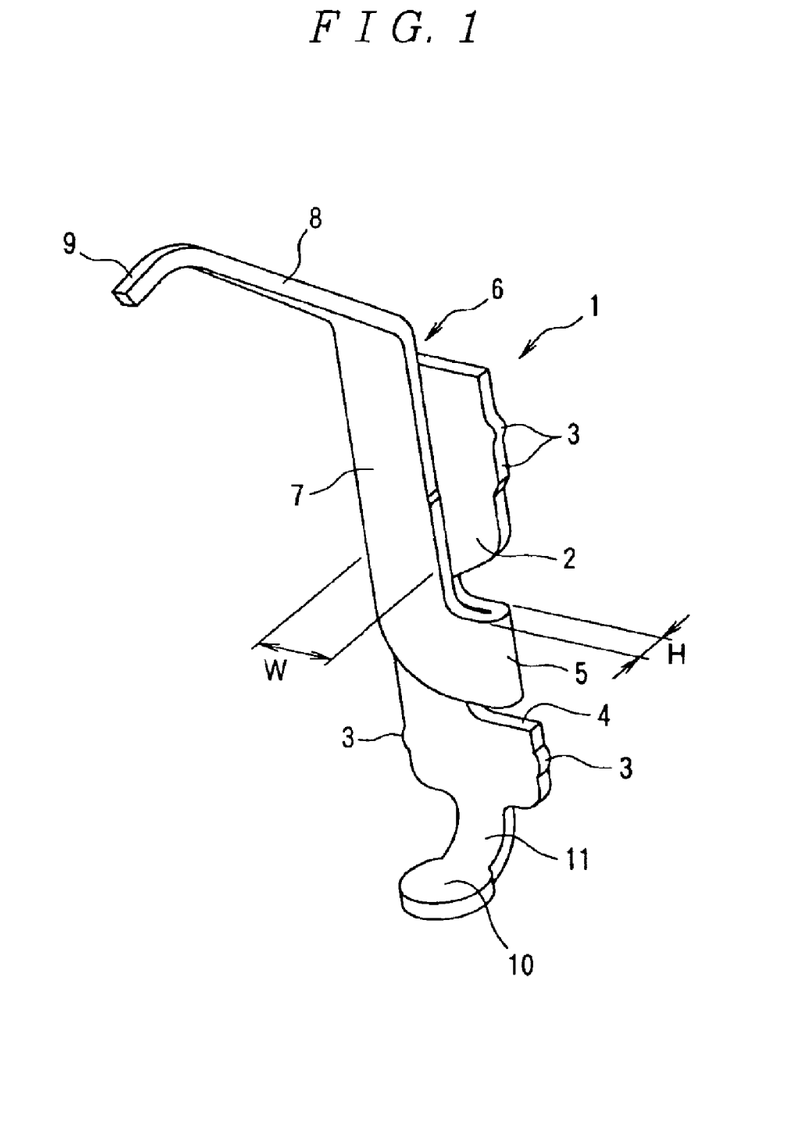
FIG. 1 is a perspective view of a first embodiment of an LGA socket contact of the invention.
Figure 2:
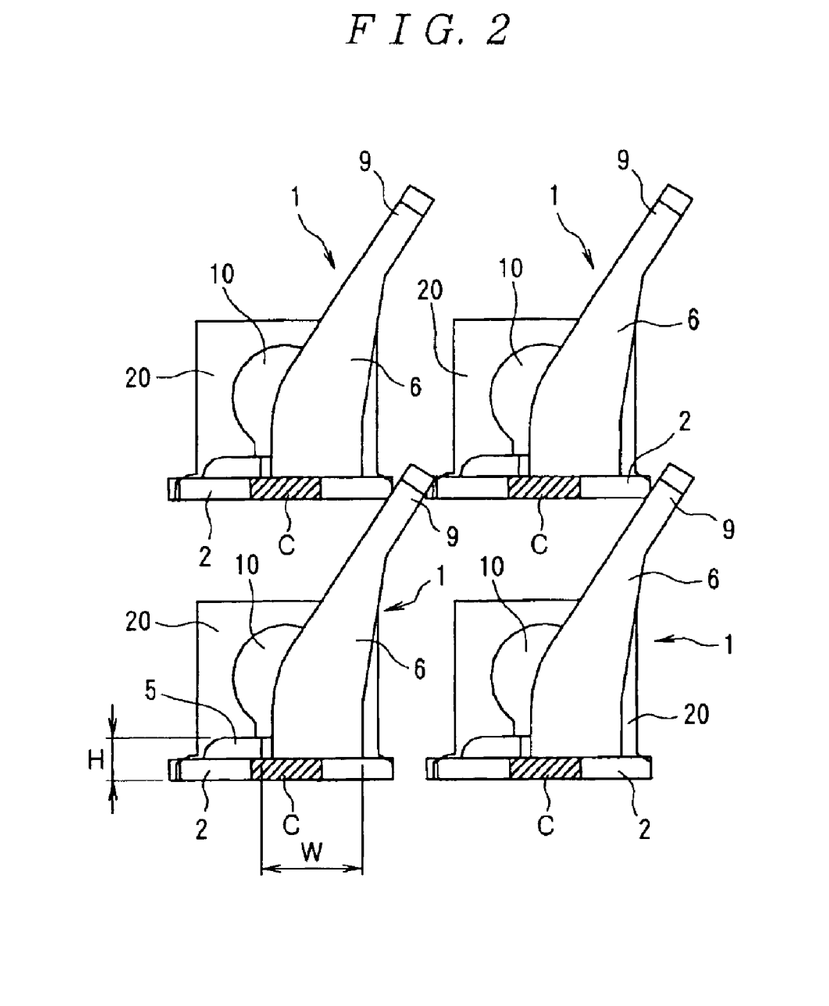
FIG. 2 is a plan view of the LGA socket contact of FIG. 1 wherein the LGA socket contact is accommodated inside a contact accommodating space.

The invention will now be described in greater detail with reference to the figures. FIGS. 1 and 2 show a first embodiment of an LGA socket contact (hereafter "contact") 1. The contact 1 is formed by stamping and forming a metal plate and has a substantially rectangular base plate 2. A plurality of anchoring projections 3 is formed on each of two side walls of the base plate 2. Two of the anchoring projections 3 are formed on an upper portion of the base plate 2 and one of the anchoring projections 3 is formed on a lower portion of the base plate 2. The anchoring projections 3 are separated by a specified gap in a vertical direction. A cut-out 4 is formed in one of the side walls of the base plate 2 between the anchoring projections 3 of the upper portion and the anchoring projection 3 of the lower portion.

As best shown in FIG. 1, a resilient contact 6 is bent upward from a tip of a curved section 5 that is angled approximately 180 degrees from the cut-out 4. The resilient contact 6 has a first elastic plate portion 7 and a second elastic plate portion 8. The plate surface of the first elastic plate portion 7 has a direction of extension parallel to a direction of extension of the plate surface of the base plate 2. The second elastic plate portion 8 extends upward at an inclination and is bent from an upper end of the first elastic plate portion 7 in a direction that separates the second elastic plate portion 8 from the base plate 2. A contact portion 9 for contacting a contact pad (not shown) formed on an IC package (not shown) is formed on a free end of the second elastic plate portion 8. The contact portion 9 has a rolled surface so that contact stability between the contact portion 9 and the contacts (not shown) is ensured.

As shown in FIGS. 1 and 2, since the curved section 5 is angled at approximately 180 degrees, a height H of the curved section 5 and the first elastic plate portion 7 in a direction perpendicular to the base plate 2 is substantially the same as twice the thickness of the metal plate that forms the contact 1. Hence, the height H of the contact 1 is smaller than the height H of the L-shaped base portion 204 and first elastic plate portion 206 of the conventional contact 200 shown in FIG. 9. The size of the contact 1 in the direction perpendicular to the base plate 2, therefore, may be minimized so that the arrangement pitch in this direction may be reduced. Further, since the height H of the curved section 5 and the first elastic plate portion 7 of the contact 1 in the direction perpendicular to the base plate 2 may be reduced, a width W of the first elastic plate portion 7 may be maximized. For example, in the contact 1, the width W of the first elastic plate portion 7 is substantially the same as the width of the curved section 5.

A solder ball attachment paddle (board terminal) 10 is disposed on a lower edge of the base plate 2 and extends via a connecting portion 11 in a direction perpendicular to the base plate 2. A solder ball (not shown) is disposed on an undersurface of the solder ball attachment paddle 10.

As shown in FIG. 2, a plurality of the contacts 1 are received in corresponding contact accommodating spaces 20 of a housing (not shown) to complete an LGA socket (not shown). The contact accommodating spaces 20 are formed in a plurality of rows to correspond to the contact pads (not shown) of the IC package (not shown). When the contacts 1 are accommodated in the contact accommodating spaces 20, the anchoring projections 3 of the contacts 1 are anchored to walls of the housing (not shown). The second contact plate portions 8 of the respective contacts 1 protrude upward beyond an upper surface of the housing (not shown). The solder ball attachment paddles 10 protrude downward beyond an undersurface of the housing (not shown). Because the anchoring projections 3 are formed on the upper and lower portions of the side walls of each base plate 2, and the resilient contact 6 of each contact 1 extends from between the anchoring projections 3, the span between the anchoring projections 3 is long. Thus, when the anchoring projections 3 are anchored to the walls of the housing (not shown), the contact portion 9 formed on the free end of each of the resilient contacts 6 can be positioned with precision.

The completed LGA socket (not shown) is mounted on the circuit board (not shown) by connecting the solder balls (not shown) disposed on the solder ball attachment paddles 10 to contact pads (not shown) on a circuit board (not shown) by soldering. When the IC package (not shown) is mounted on the LGA socket (not shown) from above, the contact pads (not shown) disposed on the IC package (not shown) contact the contact portions 9 of the respective contacts 1 and push the contact portions 9 downward so that the second elastic plate portion 8 and the first elastic plate portion 7 of each of the contacts 1 undergoes elastic deformation. The contact pads (not shown) of the IC package (not shown) and the contact pads (not shown) of the circuit board (not shown) are thereby electrically connected to each other.

When the first elastic plate portions 7 undergo deformation, since the width W of the first elastic plate portions 7 is maximized, the first elastic plate portions 7 do not undergo plastic deformation even in cases where a large external force acts on the contact portions 9 in a downward direction. The amount of displacement of the resilient contacts 6, therefore, may be increased to a large value. Further, since the width W of the first elastic plate portions 7 may be increased to a large value, the cross-sectional area of the first elastic plate portions 7 may also be increased to reduce contact resistance.

Figure 3:
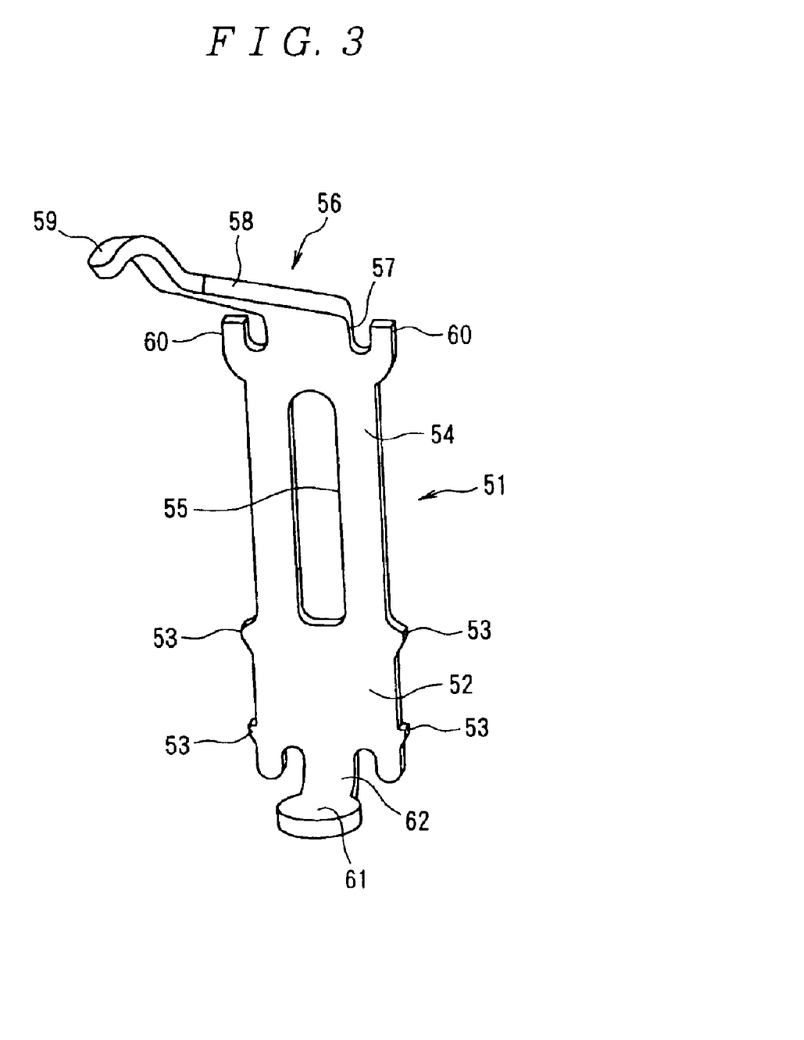
FIG. 3 is a perspective view of a second embodiment of the LGA socket contact of the invention.

A second embodiment of the LGA socket contact 51 of the invention will now be described with reference to FIGS. 3 through 5. The contact 51 is formed by stamping and forming a metal plate and has a substantially rectangular base plate 52, as shown in FIG. 3. A plurality of anchoring projections 53 is formed on each of two side walls of the base plate 52. One of the anchoring projections 53 is formed on an upper portion of the base plate 52 and one of the anchoring projections 53 is formed on a lower portion of the base plate 52. The anchoring projections 53 are separated by a specified gap in a vertical direction.

As best shown in FIG. 3, extending from the base plate 52 is an elastic plate portion 54. The elastic plate portion 54 has a width substantially the same as a width of the base plate 52, and front and back surfaces of the elastic plate portion 54 are coplanar with front and back surfaces of the base plate 52. Alternatively, the width of the elastic plate portion 54 may be different from the width of the base plate 52. The elastic plate portion 54 has a slit 55. The slit 55 extends in a vertical direction with respect to a direction of width in substantially a central portion of the elastic plate portion 54 from an upper end of the base plate 52. Carrier connecting portions 60 are disposed on both ends of the upper end of the elastic plate portion 54. A resilient contact 56 extends from substantially a central portion with respect to the direction of width from an upper end of the elastic plate portion 54. The resilient contact 56 has a first elastic plate portion 57 that extends upward from a central portion with respect to the direction of width of the upper end of the elastic plate portion 54. A second elastic plate portion 58 is bent from an upper end of the first elastic plate portion 57 upward and at an inclination in a direction that separates the second elastic plate portion 58 from the elastic plate portion 54. A contact portion 59 for contacting a contact pad (not shown) formed on an IC package (not shown) is formed on a free end of the second elastic plate portion 58. The contact portion 59 has a rolled surface so that contact stability between the contact portion 59 and the contacts (not shown) is ensured.

In the contact 51, since the elastic plate portion 54 extends upward from the upper end of the base plate 52, and the front and back surfaces of the elastic plate portion 54 are coplanar with the front and back surfaces of the base plate 52, the height of the elastic plate portion 54 in a direction perpendicular to the base plate 52 is small, i.e., approximately the same as the plate thickness of the metal plate forming the contact 51. Hence, a height of the resilient contact 56 in a direction perpendicular to the base plate 52 in a vicinity of a root of the resilient contact 56 may be minimized to reduce the arrangement pitch in this direction. Further, the width of the elastic plate portion 54 can be maximized so that the cross-sectional area of the elastic plate portion 54 may be increased to reduce connection resistance.

A solder ball attachment paddle (board terminal) 61 is disposed on a lower edge of the base plate 52 and extends via a connecting portion 62 in a direction perpendicular to the base plate 52. A solder ball (not shown) is disposed on an undersurface of the solder ball attachment paddle 61.

Figure 5:
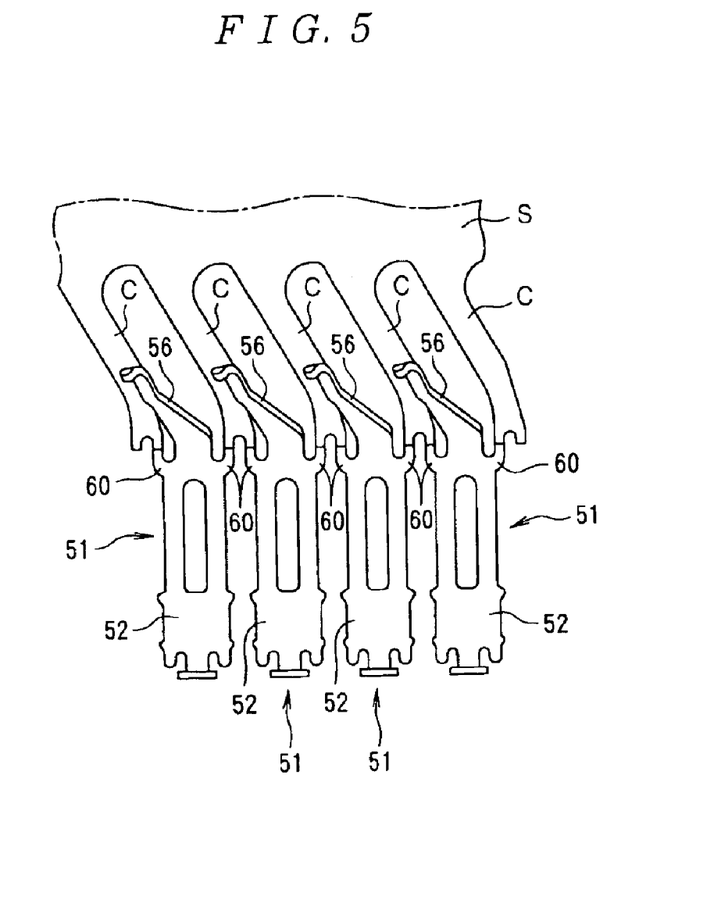
FIG. 5 is a plan view of the LGA socket contact of FIG. 3 attached to a strip.

As shown in FIG. 5, when the contact 51 is initially manufactured, the contact 51 is connected to a strip S. The carrier connecting portions 60 on both ends of each of the contacts 51 are respectively connected to two adjacent contact carriers C extending from the strip S. Adjacent carrier connecting portions 60 of adjacent contacts 51 are connected to each of the contact carriers C. Accordingly, the contacts 51 shown in FIG. 3 are disposed at a smaller pitch in a direction of extension of the strip S than in the case of the contacts 200 shown in FIG. 9. Material costs can thereby be reduced when a plurality of the contacts 51 is manufactured.

Figure 4:
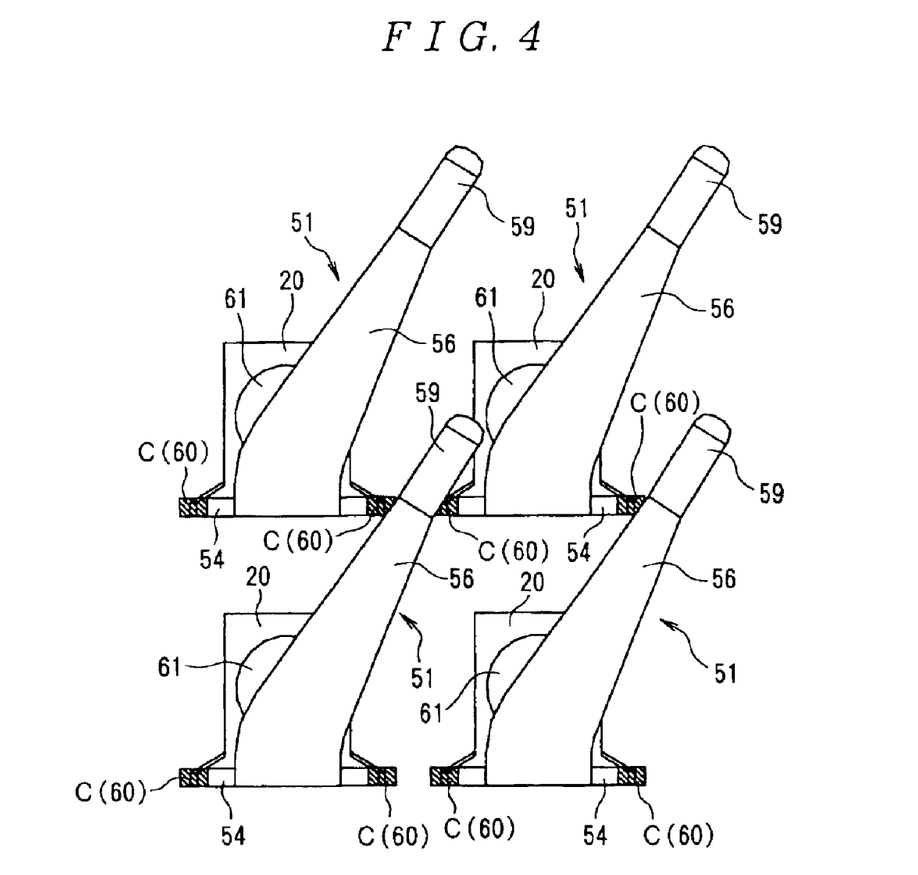
FIG. 4 is a plan view of the LGA socket contact of FIG. 3 wherein the LGA socket contact is accommodated inside the contact accommodating space.

As shown in FIG. 4, a plurality of the contacts 51 are received in corresponding contact accommodating spaces 20 of a housing (not shown) to complete an LGA socket (not shown). The contact accommodating spaces 20 are formed in a plurality of rows to correspond to the contact pads (not shown) of the IC package (not shown). When the contacts 51 are accommodated in the contact accommodating spaces 20, the anchoring projections 53 of the contacts 51 are anchored to the walls of the housing (not shown). The second contact plate portions 58 of the respective contacts 51 protrude upward beyond an upper surface of the housing (not shown). The solder ball attachment paddles 61 protrude downward beyond an undersurface of the housing (not shown).

In the accommodated state, the resilient contacts 56 of the contacts 51 accommodated in one of the rows is located in positions that overlap with the contact carriers C (carrier connecting portions 60) of the contacts 51 accommodated in an adjacent row. Hence, after a plurality of the contacts 51 of one of the rows has been inserted into the contact accommodating spaces 20, the contact carriers C of the respective contacts 51 are cut. The plurality of contacts 51 of the adjacent row are then inserted into the contact accommodating spaces 20, and the contact carriers C of the respective contacts 51 are cut.

On the other hand, the contacts 1 of the first embodiment are accommodated inside the plurality of rows of the contact accommodating spaces 20 as shown in FIG. 2. In the accommodated state, the resilient contacts 6 of the contacts 1 accommodated in one of the rows are not located in positions that overlap with the contact carriers C of the contacts 1 accommodated in an adjacent row. Specifically, the contact carriers C of the respective contacts 1 are cut after both the plurality of contacts 1 of one of the rows and the plurality of contacts 1 of the adjacent row have been inserted into the contact accommodating spaces 20. Thus, the accommodation of the contacts 1 shown in FIG. 1 can be accomplished more easily than the accommodation of the contacts 51 shown in FIG. 3.

The LGA socket (not shown) is mounted on a circuit board (not shown) by soldering the solder balls (not shown) disposed on the solder ball attachment paddles 61 of the respective contacts 51 to contact pads (not shown) on the circuit board (now shown). When the IC package (not shown) is mounted on the LGA socket (not shown) from above, the contact pads (not shown) disposed on the IC package (not shown) contact the contact portions 59 of the respective contacts 51 and push the contact portions 59 downward so that the second elastic plate portions 58, the first elastic plate portions 57, and the elastic plate portions 54 undergo elastic deformation. The contact pads (not shown) of the IC package (not shown) and the contact pads (not shown) of the circuit board (not shown) are thereby electrically connected to each other. Since the flexibility of the elastic plate portions 54 is increased as a result of the formation of the slits 55 that extend in the vertical direction in the approximate central portions of the elastic plate portions 54 with respect to the direction of width, the elastic plate portions 54 easily undergo elastic deformation. Since the elastic plate portions 54, the first elastic plate portions 57, and the second elastic plate portions 58 that are located above the base plates 52 that are anchored to the housing (not shown) all undergo elastic deformation, the spring length may be made longer so that the amount of displacement of the resilient contacts 56 may be increased. Since the spring length may be made longer, plastic deformation does not occur even if the plate thickness of the contacts 51 is increased, because the connection resistance may be correspondingly reduced.

Figure 6A:
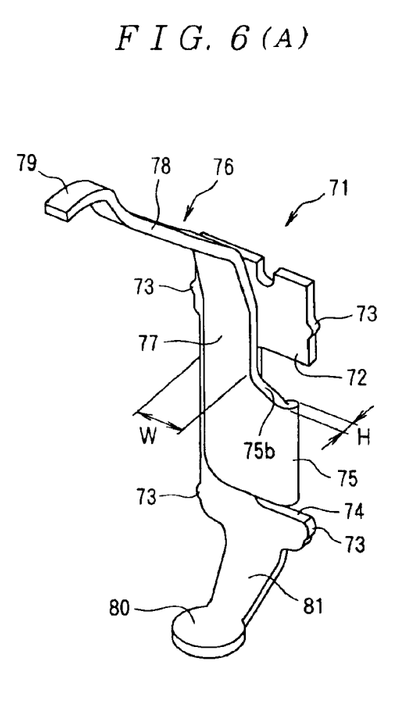
FIG. 6(A) is a perspective view of the LGA socket contact seen at an inclination from above on a side of a front surface.
Figure 6B:
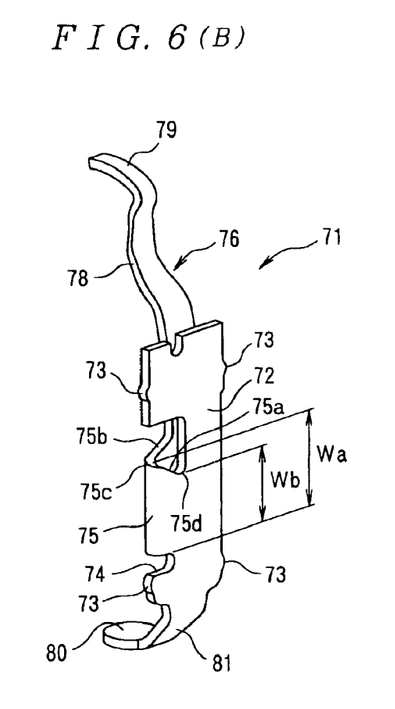
FIG. 6(B) is a perspective view of the LGA socket contact seen at an inclination from above on a side of a back surface.

A third embodiment of the LGA socket contact 71 of the invention will now be described with reference to FIG. 6. As shown in FIG. 6, the contact 71 has the same basic structure as the contact 1 of the first embodiment. The contact 71 is formed by stamping and forming a metal plate and has a substantially rectangular base plate 72. A plurality of anchoring projections 73 is formed on each of two side walls of the base plate 72. The anchoring projections 73 are formed on upper and lower portions of the base plate 72. The anchoring projections 73 are separated by a specified gap in a vertical direction. A cut-out 74 is formed in one of the side walls of the base plate 72 between the upper and lower anchoring projections 73.

A resilient contact 76 extends from the cut-out 74 from a tip of a curved section 75 that is angled approximately 180 degrees. The resilient contact 76 has a first elastic plate portion 77a and a second elastic plate portion 78. The first elastic plate portion 77 is bent upward at an inclination from the free end of the curved section 75. The plate surface of the first elastic plate portion 77 has a direction of extension parallel to a direction of extension of the plate surface of the base plate 72. The second elastic plate portion 78 is bent from an upper end of the first elastic plate portion 77 in a direction that separates the elastic plate portion 78 from the base plate 72. A contact portion 79 for contacting a contact pad (not shown) formed on an IC package (not shown) is formed on a free end of the second elastic plate portion 78. The contact portion 79 has a rolled surface so that contact stability between the contact portion 79 and the contacts (not shown) is ensured.

The contact 71 differs from the contact 1 of the first embodiment in that the contact 71 includes first and second tapered portions 75a, 75b, respectively. The first tapered portion 75a is formed on an upper surface of the curved section 75 on a side of a base plate 72. The first tapered portion 75a drops continuously toward a root portion 75d from a portion 75c that is angled approximately 180 degrees. The second tapered portion 75b is formed on an upper surface of the curved section 75 on a side of the resilient contact 76. The second tapered portion 75b rises continuously toward a side wall of a first elastic plate portion 77 from the portion 75c that is angled approximately 180 degrees. As a result of the formation of the first tapered portion 75a, the width in a vertical direction of the curved section 75 on the side of the base plate 72 decreases continuously from Wa to Wb toward the root portion 75d from the portion 75c that is angled approximately 180 degrees. As a result of the formation of the second tapered portion 75b, the width in a vertical direction of the curved section 75 on the side of the resilient contact 76 increases continuously toward the first elastic plate portion 77 from the portion 75c that is angled approximately 180 degrees.

A solder ball attachment paddle (board terminal) 80 is disposed on a lower edge of the base plate 72 and extends via a connecting portion 81 in a direction perpendicular to the base plate 72. A solder ball (not shown) is disposed on an undersurface of the solder ball attachment paddle 80.

In the contact 71, a height H of the curved section 75 and the first elastic plate portion 77 in a direction perpendicular to the base plate 72 is substantially the same as twice the thickness of the metal plate that forms the contact 71, because the curved section 75 is angled approximately 180 degrees. Hence, the height H is smaller than the height H of the L-shaped base portion 204 and the first elastic plate portion 206 of the contact 200 shown in FIG. 9. The size of the contact 71 in the direction perpendicular to the base plate 72, therefore, may be minimized so that an arrangement pitch in this direction can be reduced. Further, since the height H of the curved section 75 and the first elastic plate portion 77 in the direction perpendicular to the base plate 72 may be reduced, the width W of the first elastic plate portion 77 may be maximized. Accordingly, the cross-sectional area of the first elastic plate portion 77 may be increased to reduce connection resistance.

Unlike the contact 1 of the first embodiment, since the width in the vertical direction of the curved section 75 on the side of the base plate 72 decreases continuously from Wa to Wb, the region where the resilient contact 76 acts as a spring is expanded to the root portion 75d of the curved section 75. Also unlike the contact 1 of the first embodiment, since the width in the vertical direction of the curved section 75 on the side of the resilient contact 76 increases continuously toward the first elastic plate portion 77, the cross-sectional area of the curved section 75 on the side of the resilient contact 76 may be increased so that a current path with a relatively large cross-sectional area is ensured.

The foregoing illustrates some of the possibilities for practicing the invention. Many other embodiments are possible within the scope and spirit of the invention. For example, in the contact 1 of the first embodiment, the resilient contact 6 extends from a curved section 5 from a cut-out 4 formed between the upper and lower anchoring projections 3. The resilient contact 6, alternatively, could extend from the curved section 5 from the side wall of the base plate 2 without forming a cut-out 4. It is, therefore, intended that the foregoing description be regarded as illustrative rather than limiting, and that the scope of the invention is given by the appended claims together with their full range of equivalents.

We claim:

1. A land grid array socket contact, comprising:
   a base plate having side walls;
   a resilient contact extending parallel to the base plate and attached to at least one of the side walls of the base plate by a curved section angled approximately 180 degrees from the at least one side wall, the resilient contact having a free end for contacting a contact pad; and
   a board terminal that extends from a lower end of the base plate for connection to a circuit board.

2. The contact of claim 1, further comprising anchoring projections formed on the side walls of the base plate.

3. The contact of claim 1, wherein the free end has a rolled surface.

4. The contact of claim 1, wherein the contact is formed from a metal plate and a height of the curved section and the resilient contact in a direction perpendicular to the base plate is substantially twice the thickness of the metal plate.

5. The contact of claim 1, wherein a second resilient contact extends between the resilient contact and the free end, the second resilient contact extending at an inclination from an upper end of the resilient contact.

6. The contact of claim 1, wherein the resilient contact has a second elastic plate portion that extends away from the base plate.

7. The contact of claim 1, wherein the resilient contact and the curved section have substantially the same width.

8. The contact of claim 1, wherein the board terminal extends approximately perpendicular to the base plate.

9. The contact of claim 8, wherein the board terminal extends via a connecting portion.

10. The contact of claim 1, wherein the curved section extends from a cut-out formed in the base plate.

11. The contact of claim 1, wherein the curved section includes a first tapered portion formed on an upper surface thereof on a side of the base plate to increase elasticity.

12. The contact of claim 1, wherein the curved section includes a second tapered portion formed on an upper surface thereof on a side of the resilient contact to form a current path with a large cross-sectional area.

13. A land grid array socket contact formed from a metal plate, comprising:
    a base plate having side walls;
    a resilient contact extending parallel to the base plate and attached to at least one of the side walls of the base plate by a curved section so that a height of the curved section and the resilient contact in a direction perpendicular to the base plate is substantially twice the thickness of the metal plate, the resilient contact having a free end for contacting a contact pad; and
    a board terminal that extends from a lower end of the base plate for connection to a circuit board.

14. The contact of claim 13, further comprising anchoring projections formed on the side walls of the base plate.

15. The contact of claim 13, wherein the free end has a rolled surface.

16. The contact of claim 13, wherein a second resilient contact extends between the resilient contact and the free end, the second resilient contact extending at an inclination away from an upper end of the resilient contact.

17. The contact of claim 13, wherein the resilient contact and the curved section have substantially the same width.

18. The contact of claim 13, wherein the board terminal extends perpendicular to the base plate via a connecting portion.

19. The contact of claim 13, wherein the curved section extends from a cut-out formed in the base plate.

20. The contact of claim 13, wherein the curved section includes a first tapered portion formed on an upper surface thereof on a side of the base plate to increase elasticity.

21. The contact of claim 13, wherein the curved section includes a second tapered portion formed on an upper surface thereof on a side of the resilient contact to form a current path with a large cross-sectional area.

* * * * *